US007612319B2

(12) United States Patent
Li et al.

(10) Patent No.: US 7,612,319 B2
(45) Date of Patent: Nov. 3, 2009

(54) METHOD AND APPARATUS PROVIDING A MICROLENS FOR AN IMAGE SENSOR

(75) Inventors: Jiutao Li, Boise, ID (US); Jin Li, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/449,756

(22) Filed: Jun. 9, 2006

(65) Prior Publication Data

US 2007/0284510 A1 Dec. 13, 2007

(51) Int. Cl.
*G02B 3/08* (2006.01)
*G02B 27/42* (2006.01)
*H01L 27/146* (2006.01)

(52) U.S. Cl. ............... 250/208.1; 359/619; 359/626; 359/628; 359/455; 359/741

(58) Field of Classification Search .............. 250/208.1; 348/291, 340, 294; 359/619–629, 455–457, 359/463, 741–742
See application file for complete search history.

(56) References Cited

U.S. PATENT DOCUMENTS

| 6,040,591 | A | 3/2000 | Otsuka |
| 6,140,630 | A * | 10/2000 | Rhodes ............... 250/208.1 |
| 6,204,524 | B1 * | 3/2001 | Rhodes ............... 257/222 |
| 6,310,666 | B1 * | 10/2001 | Moon ............... 349/40 |
| 6,326,652 | B1 * | 12/2001 | Rhodes ............... 257/231 |
| 6,333,205 | B1 * | 12/2001 | Rhodes ............... 438/69 |
| 6,376,868 | B1 * | 4/2002 | Rhodes ............... 257/215 |
| 6,437,918 | B1 | 8/2002 | Hamanaka et al. |
| 6,818,934 | B1 | 11/2004 | Yamamoto |
| 6,852,591 | B2 * | 2/2005 | Rhodes ............... 438/244 |
| 6,911,684 | B2 | 6/2005 | Yamamoto |
| 6,933,167 | B2 | 8/2005 | Yamamoto |
| 6,950,140 | B2 | 9/2005 | Fukuyoshi et al. |
| 6,984,934 | B2 | 1/2006 | Möller et al. |
| 7,009,652 | B1 * | 3/2006 | Tanida et al. ........... 348/340 |
| 2002/0149717 | A1 * | 10/2002 | Borrelli et al. ........... 349/95 |
| 2004/0223071 | A1 | 11/2004 | Wells et al. |
| 2004/0263860 | A1 * | 12/2004 | Johnson ............... 356/499 |
| 2006/0006485 | A1 | 1/2006 | Mouli |
| 2006/0076697 | A1 * | 4/2006 | Lee et al. ............... 264/1.21 |
| 2006/0183027 | A1 * | 8/2006 | Lin et al. ............... 430/5 |
| 2006/0284052 | A1 * | 12/2006 | Toshikiyo et al. ........ 250/208.1 |
| 2007/0069108 | A1 | 3/2007 | Inaba |
| 2007/0146531 | A1 * | 6/2007 | Toshikiyo ............... 348/340 |
| 2007/0164329 | A1 * | 7/2007 | Toshikiyo ............... 257/291 |

FOREIGN PATENT DOCUMENTS

| EP | 1 696 249 A1 | 8/2006 |
| WO | WO 2005/059607 A1 | 6/2005 |
| WO | WO 2005/076361 A1 | 8/2005 |

OTHER PUBLICATIONS

International Preliminary Report on Patentability, Nov. 23, 2007.

* cited by examiner

*Primary Examiner*—John R Lee
(74) *Attorney, Agent, or Firm*—Dickstein Shapiro LLP

(57) ABSTRACT

A microlens having a plurality of lens material units separated by a plurality of trenches and a method of forming the same is disclosed. The relationship of the trenches to the lens material is such that an average index of refraction of the microlens decreases from a center to an edge of the microlens.

35 Claims, 12 Drawing Sheets

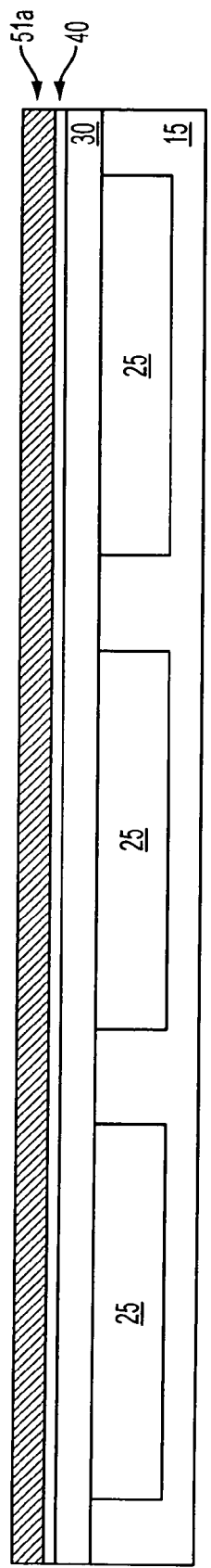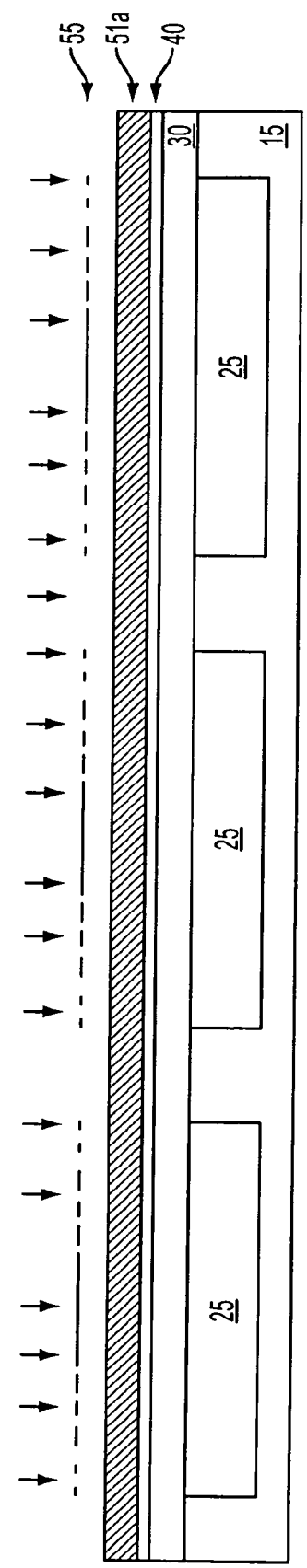

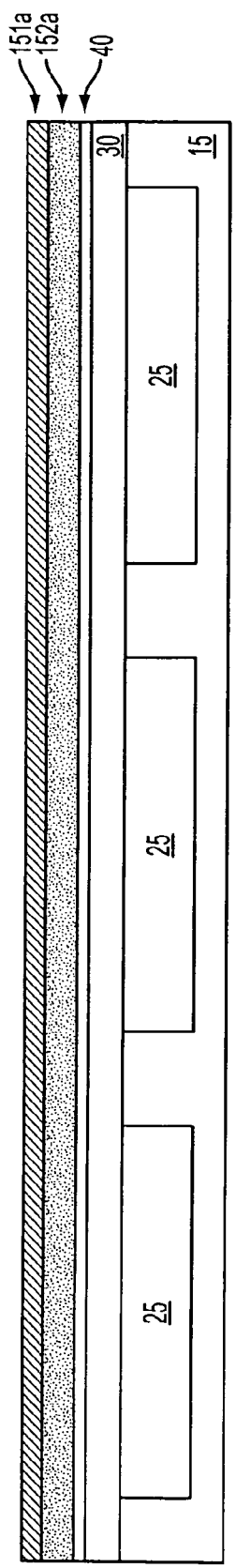
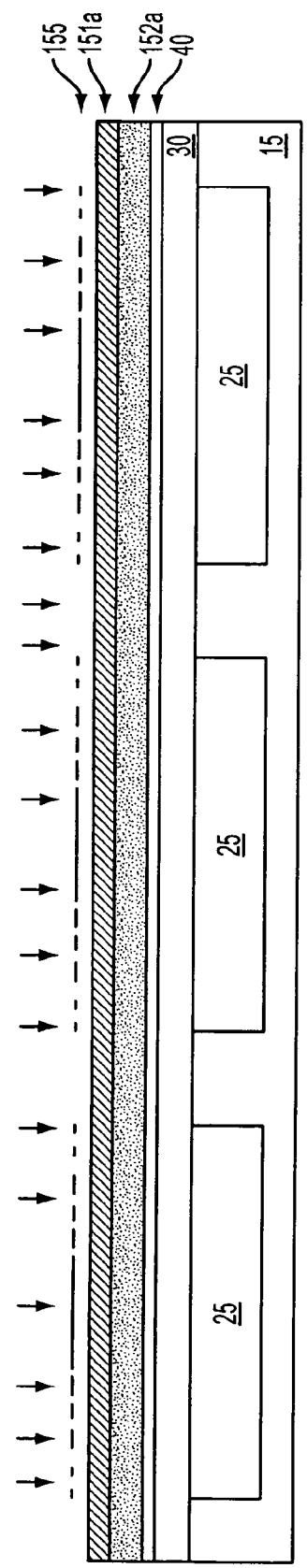

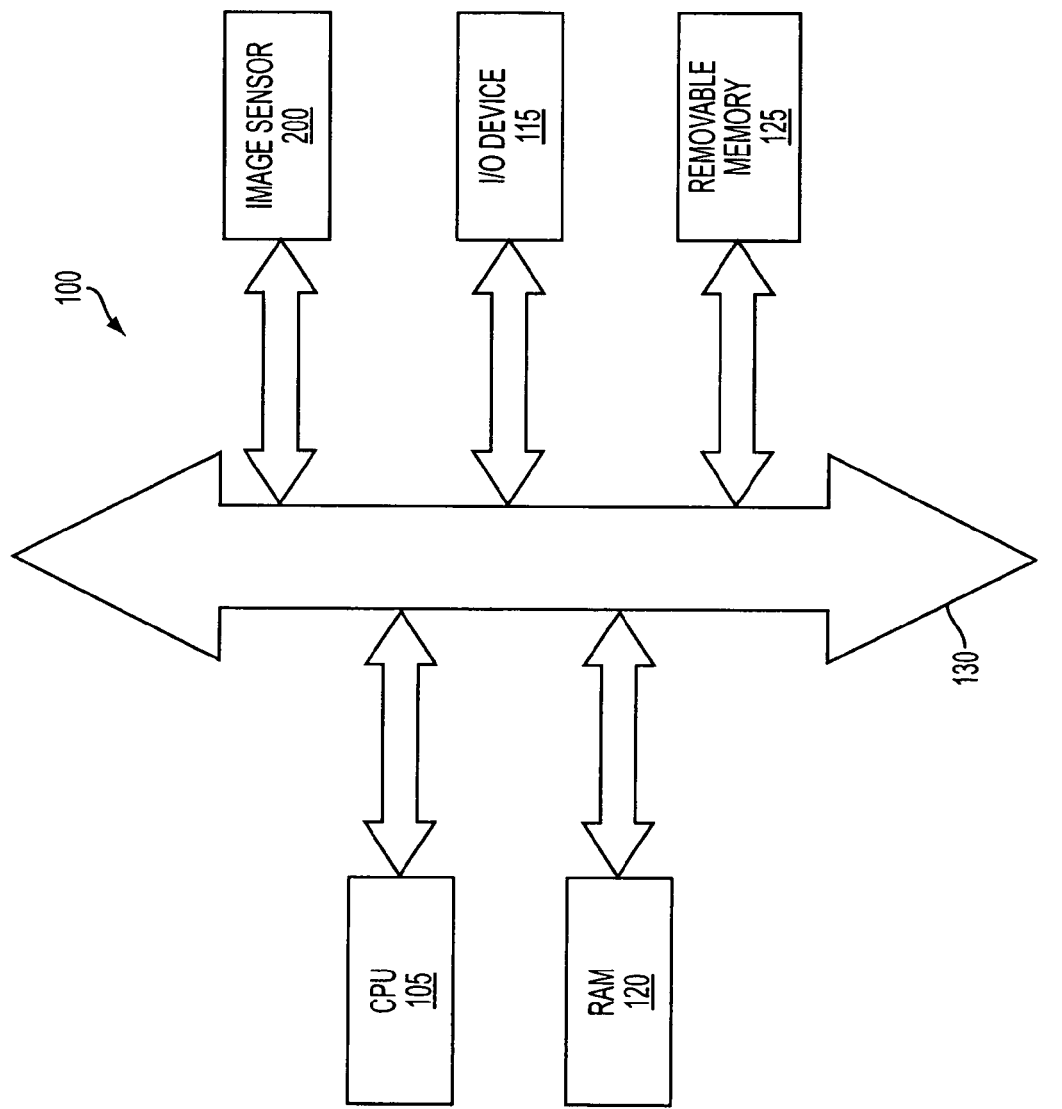

METHOD AND APPARATUS PROVIDING A MICROLENS FOR AN IMAGE SENSOR

FIELD OF THE INVENTION

The invention relates to a microlens for an image sensor and a method for producing the same.

BACKGROUND OF THE INVENTION

Solid state imaging devices, including charge coupled devices (CCD) and complementary metal oxide semiconductor (CMOS) sensors, have commonly been used in photoimaging applications. A CMOS imager circuit includes a focal plane array of pixels, each one of the pixels including a photosensor, i.e., a photosensitive region, for example, a photogate, photoconductor or a photodiode for accumulating photo-generated charge in the specified portion of the substrate. Each pixel has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel charge. Photo charge may be amplified when it moves from the initial charge accumulation region to the storage region. The charge at the storage region is typically converted to a pixel output voltage by a source follower output transistor.

Examples of CMOS imaging sensors, processing steps thereof, and detailed descriptions of the functions of various CMOS elements of an imaging sensor are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; U.S. Pat. No. 6,333,205; and U.S. Pat. No. 6,852,591, all of which are assigned to Micron Technology, Inc., and hereby incorporated by reference in their entirety.

In solid state imagers, the use of microlenses significantly improves the photosensitivity of the image sensor by collecting incident light from a large light collecting area and focusing the light onto a small photosensitive region of an underlying pixel. A microlens is generally formed having a curved shaped on a planarized region over the photosensitive area of a pixel. After passing through the planarized region, the incident light is typically filtered by an associated color filter as the light travels to the photosensitive region. Each pixel can have its own associated color filter.

As the size of image sensor arrays and pixel photosensors continue to decrease, it becomes increasingly difficult to provide a microlens capable of focusing incident light rays onto the photosensors. This problem is due in part to the increased difficulty in constructing a microlens that has the optimal focal characteristics for the increasingly smaller photosensors.

Conventional technology forms a curved shaped microlens from specific types of photoresist materials patterned as squares or circles which are provided over respective pixels. The patterned photoresist material is heated during manufacturing to obtain the curved shaped microlens.

Microlens shaping and fabrication through heating and melting microlens material becomes increasingly difficult as microlens structures decrease in size. Previous approaches to control microlens shaping and fabrication do not provide sufficient control to ensure optical properties such as focal characteristics, radius of curvature of the microlens or other parameters needed to provide a desired focal effect for smaller microlens designs. Consequently, image sensors with smaller sized microlenses have difficulty in achieving high color fidelity and acceptable signal-to-noise ratios.

BRIEF DESCRIPTION OF THE DRAWINGS

Features and advantages of the invention will be more clearly understood from the following detailed description, which is provided with reference to the accompanying drawings in which:

FIGS. 7a, 7b, 7c, and 7d illustrate a method of forming a portion of an imager array as shown in FIG. 5;

FIGS. 8a, 8b, 8c, and 8d illustrate another method of forming a portion of an imager array as shown in FIG. 5;

FIG. 10 shows a block diagram of a system having an imager constructed in accordance with an embodiment of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention.

The term "substrate" is to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photosensor (i.e., photosensitive region) and transistors for converting electromagnetic radiation to an electrical signal. Although the invention is described below with reference to an image sensor, such as a CMOS image sensor, the invention has applicability to any solid state image sensor having pixel cells. The following detailed description is, therefore, not to be taken in a limiting sense, and the scope of the present invention is defined only by the appended claims.

The invention provides a novel method and apparatus providing a microlens structure in the form of a series of trenches separating units of a lens material. The cross-sectional width of the trenches increases in a direction from the center of the microlens to its edge while the cross-sectional width of the lens material units between the trenches decreases or remains constant in the direction from the center of the micro lens to its edge. The microlens can be fabricated in a very small size and can be used in place of conventional curved lens microlens structures. The cross-sectional widths changes providing a lens with an average refractive index which reduces from the center to the edge of each lens. Various embodiments of the inventions are described below.

Figure 1:
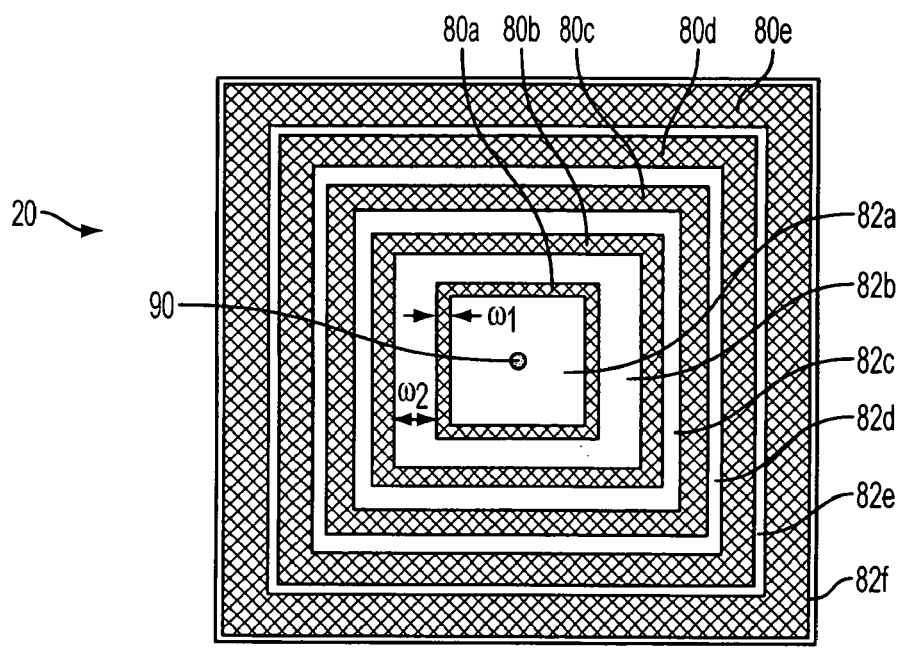
FIG. 1 shows a top-down view of a microlens constructed in accordance with a first embodiment of the invention.

Now referring to the figures, where like elements are designated by like reference numerals, FIG. 1 illustrates a top-down view of an example of a microlens 20 constructed in accordance with a first embodiment of the invention and substantially in a square shape. The microlens 20 has a series of trenches 80a, 80b, 80c, 80d, 80e arranged in a square pattern which separate lens material units 82b, 82c, 82d, 82e, 82f. The focal point 90 of the underlying photosensitive region is substantially in the center of the microlens 20. Also, from the trench 80a closest to the microlens 20 center, i.e., lens material unit 82a, to the trench 80e closest to the microlens 20 edge, i.e., lens material unit 82f, the cross-sectional widths $W_1$ of the trenches 80a, 80b, 80c, 80d, 80e increase while the cross-sectional widths $W_2$ of the lens material units 82b, 82c, 82d, 82e, 82f decrease.

Figure 2:
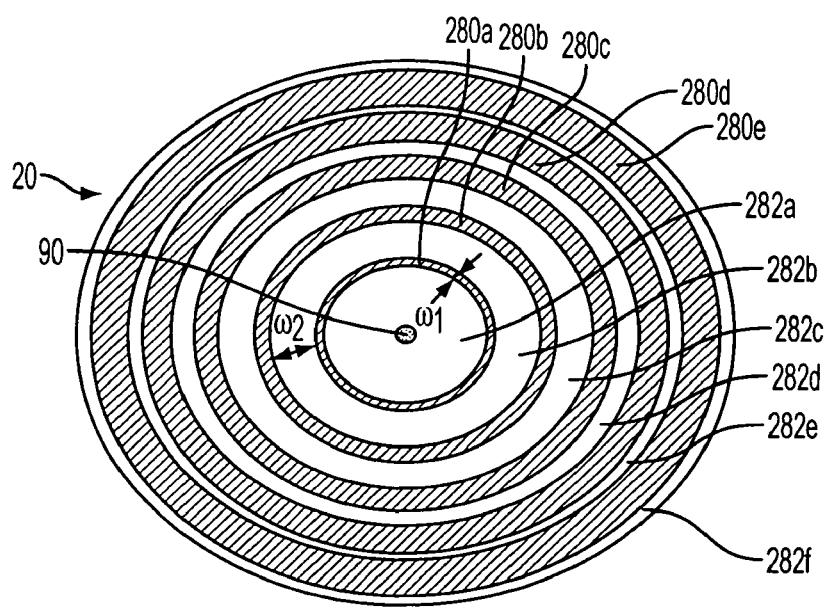
FIG. 2 illustrates a top-down view of a microlens constructed in accordance with a second embodiment of the invention.

FIG. 2 illustrates another example of a top-down view of a microlens 20 constructed in accordance with a second embodiment of the invention and substantially in a circular shape. The microlens 20 has a series of trenches 280a, 280b, 280c, 280d, 280e arranged in a circular pattern which separate lens material units 282b, 282c, 282d, 282e, 282f. The focal point 90 of the underlying photosensitive region is substantially centered in the microlens 20. Starting from the trench 280a closest to the center of the microlens 20, i.e., lens material unit 282a, to the trench 280e closest to the edge of the microlens 20, i.e., lens material unit 282f, the cross-sectional widths $W_1$ of the trenches 280a, 280b, 280c, 280d, 280e increase while the cross-section widths $W_2$ of the lens material units 82b, 282c, 282d, 282e, 282f decrease.

Figure 3A:
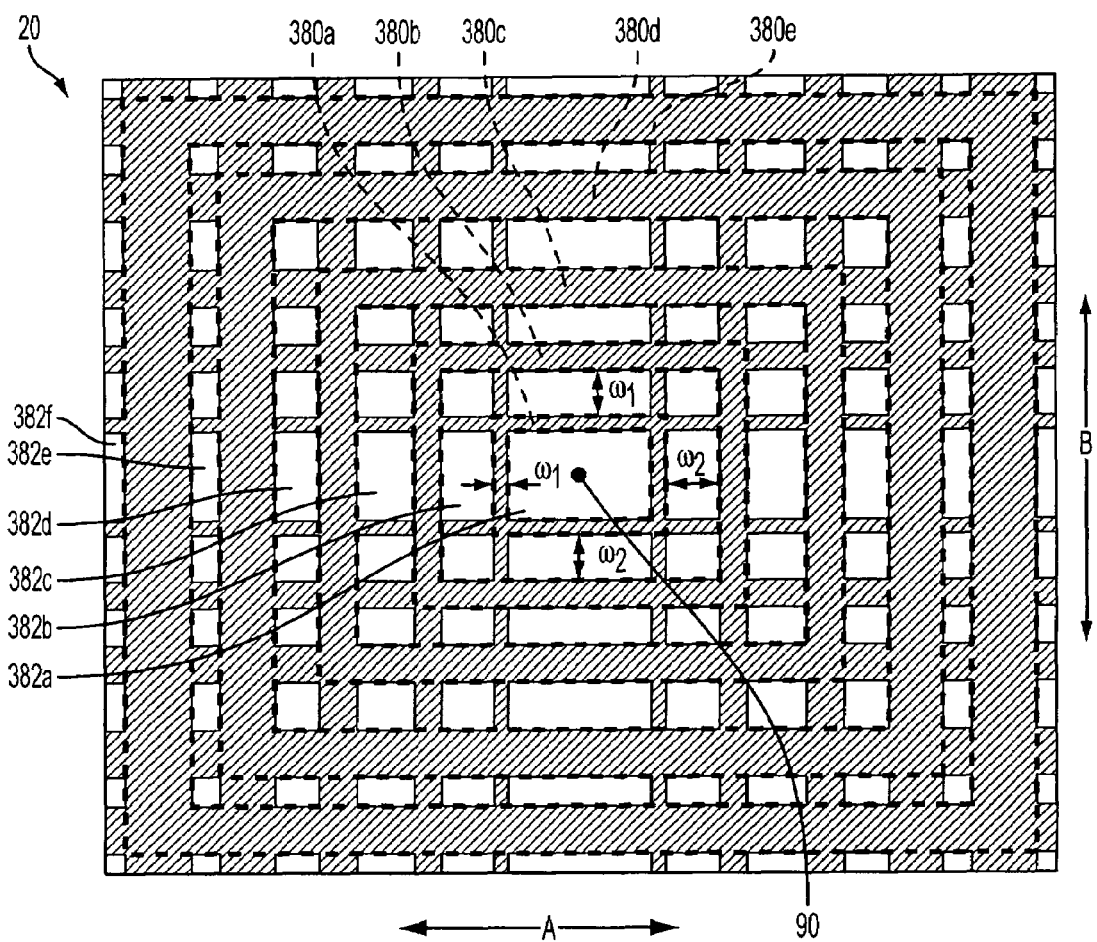
FIGS. 3a, 3b shows a top-down view of a microlens constructed in accordance with a third embodiment of the invention.

FIG. 3a illustrates another example of a top-down view of a microlens 20 constructed in accordance with a third embodiment of the invention and substantially in a square shape. The microlens 20 has a first set of trenches 380a, 380b, 380c, 380d, 380e arranged in a square pattern which separate lens material units 382b, 382c, 382d, 382e, 382f. Additionally, each lens material unit 382b, 382c, 382d, 382e, 382f is further segmented and comprises a plurality of lens material blocks 382ba, 382bb, 382bc, 382bd, 382be, 382bh, 382bi, 382bg, 382bh separated by a second set of horizontal and vertical trenches 300a, 300b, 300c, 300d, 300e, 300h, 300i, 300g, 300h, as shown in greater detail in FIG. 3b.

Figure 3B:
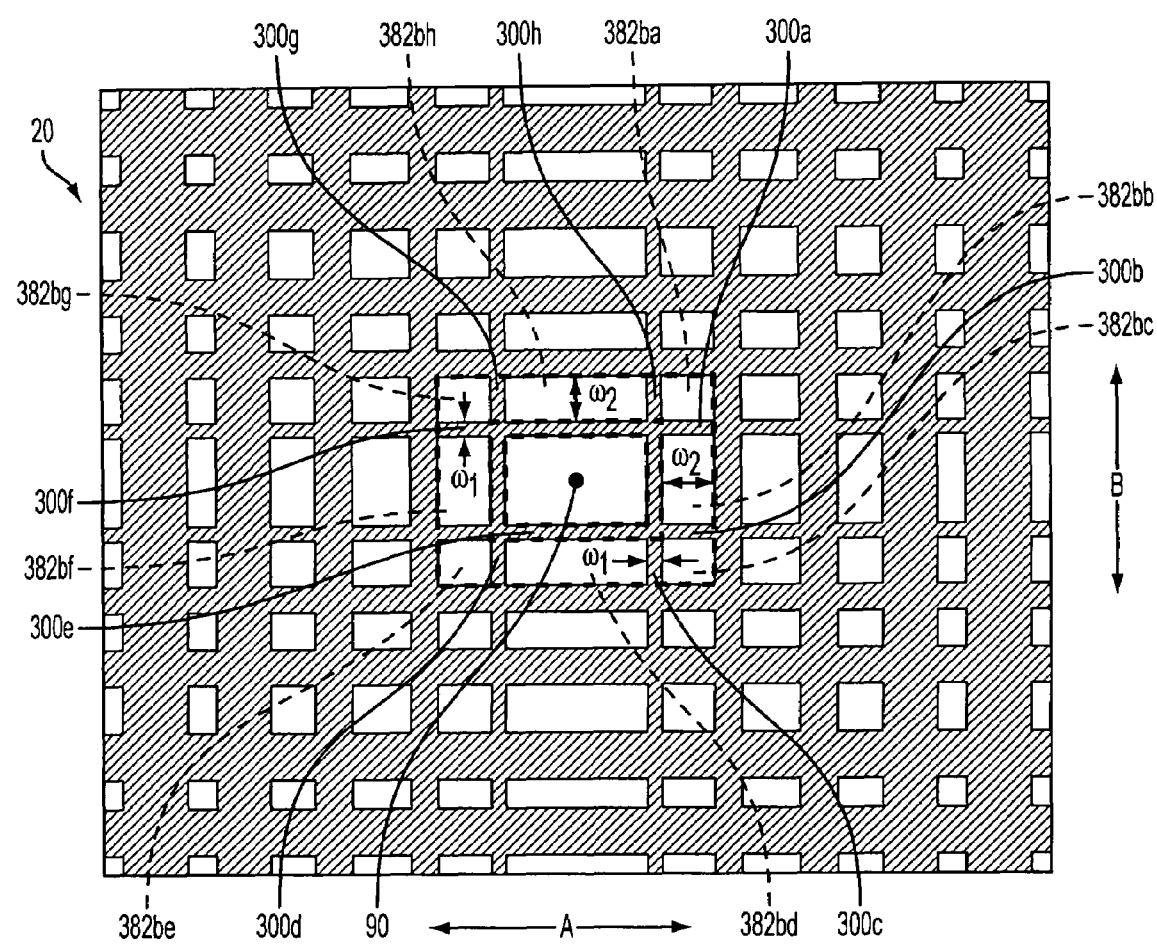

FIG. 3b depicts microlens lens material unit 382b shown in FIG. 3a comprising the plurality of lens material blocks 382ba, 382bb, 382bc, 382bd, 382bh, 382bi, 382bg, 382bh separated by the second set of trenches 300a, 300b, 300c, 300d, 300e, 300h, 300i, 300g, 300h. The cross-sectional widths $W_1$ of the second set of trenches 300a, 300b, 300c, 300d, 300e, 300h, 300i, 300g, 300h increases in the direction from the center of the microlens 20 to its edge. The cross-sectional widths $W_2$ of the lens material blocks 382ba, 382bb, 382bc, 382bd, 382be, 382bh, 382bi, 382bg, 382bh decrease in the direction from the center of the microlens 20 to its edge. This occurs in two different orthogonal directions A and B of microlens 20.

The focal point 90 of the underlying photosensitive region for the microlens 20 shown in FIGS. 3a and 3b is substantially in the center. Similar to FIGS. 1 and 2, FIG. 3a illustrates that in the direction from the trench 380a closest to the microlens 20 center, i.e., lens material unit 382a, to the trench 380e closest to the microlens 20 edge, i.e., lens material unit 382f, the cross-sectional widths $W_1$ of the trenches 380a, 380b, 380c, 380d, 380e increase while the cross-sectional widths $W_2$ of the lens material units 382b, 382c, 382d, 382e, 382f decrease. This also occurs in two different orthogonal directions A and B of microlens 20.

Figure 4A:
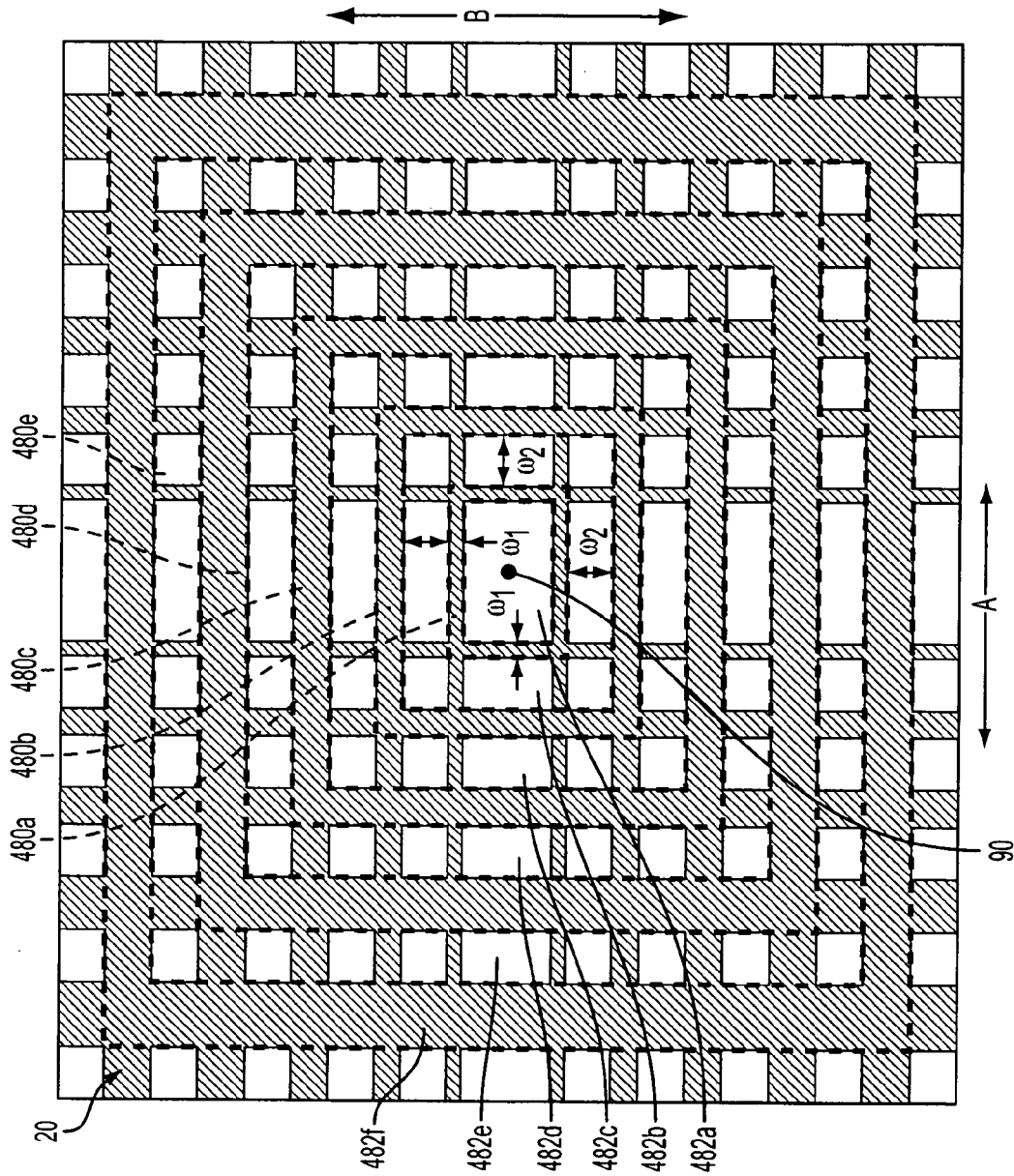
FIGS. 4a, 4b shows a top-down view of a microlens constructed in accordance with a fourth embodiment of the invention.
Figure 4B:
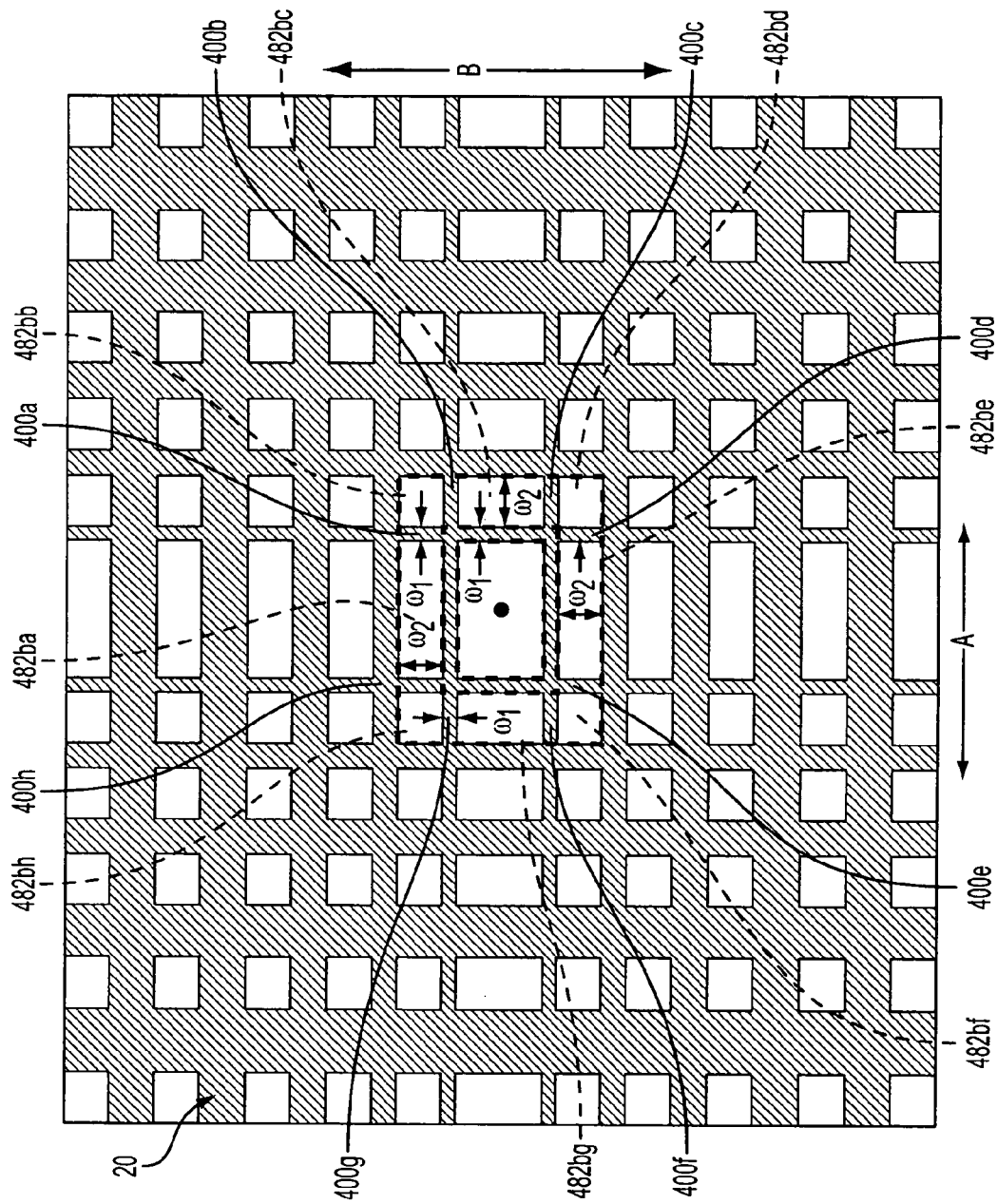

FIG. 4a illustrates an example of a top-down view of a microlens 20 constructed in accordance with a fourth embodiment of the invention and substantially in a square shape. The microlens 20 has a first set of trenches 480a, 480b, 480c, 480d, 480e arranged in a square pattern which separate lens material units 482b, 482c, 482d, 482e, 482f. Furthermore, better shown in FIG. 4b, each microlens lens material unit, e.g., 482b, comprises a plurality of lens material blocks, e.g., 482ba, 482bb, 482bc, 482bd, 482be, 482bh, 482bi, 482bg, 482bh, separated by the second set of trenches 400a, 400b, 400c, 400d, 400e, 400h, 400i, 400g, 400h. The cross-sectional widths $W_1$ of the second set of trenches 400a, 400b, 400c, 400d, 400e, 400h, 400i, 400g, 400h increases in the direction from the center of the microlens 20 to its edge. The cross-sectional widths $W_2$ of lens material blocks 482ba, 482bb, 482bc, 482bd, 482be, 482bh, 482bi, 482bg, 482bh remain substantially the same in the direction from the center of the microlens 20 to its edge. This occurs in two different orthogonal directions A and B of microlens 20.

Referring back to FIG. 4a, the focal point 90 of the underlying photosensitive region is substantially in the center of the microlens 20. Unlike FIGS. 1, 2, and 3, in the direction from the trench 480a closest to the microlens 20 center, i.e., lens material unit 482a, to the trench 480e closest to the microlens 20 edge, i.e., lens material unit, 482f, the cross-sectional widths $W_1$ of the trenches 480a, 480b, 480c, 480d, 480e increase while the cross-sectional widths $W_2$ of the lens material units 482b, 482c, 482d, 482e, 482f remain substantially the same. Like FIG. 3a, this occurs in two different orthogonal directions A and B of microlens 20.

Figure 5:
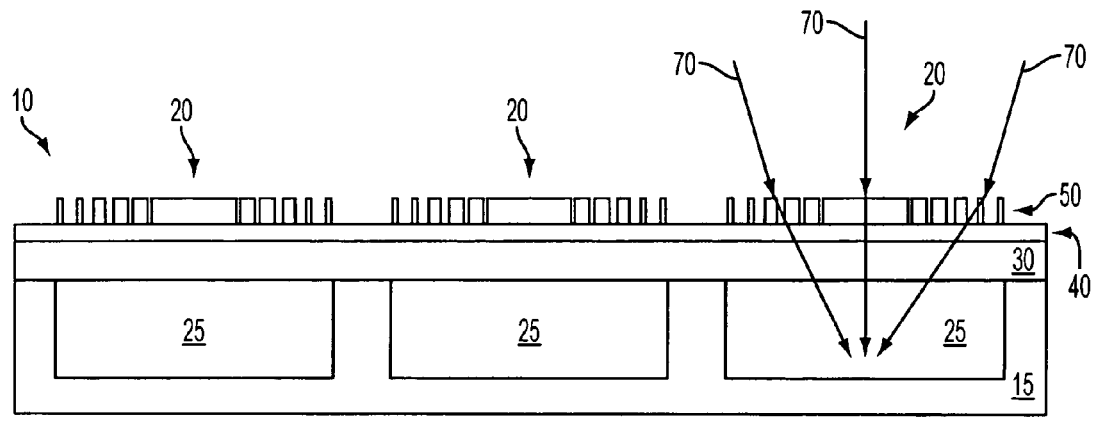
FIG. 5 illustrates a cross-sectional view of a portion of an imager array with a microlens array including a microlens shown in FIG. 1.
Figure 6:
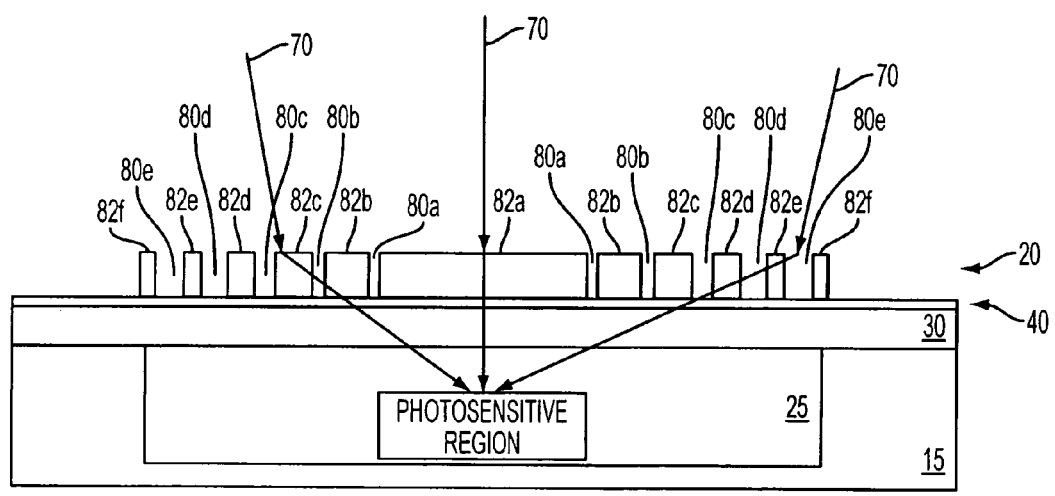
FIG. 6 illustrates one pixel shown in FIG. 5.

FIG. 5 illustrates a cross-sectional view of a portion of an imager array 10 having a microlens array 50 comprising a plurality of microlenses 20 arranged over respective pixels and substrate as shown in FIG. 1, while FIG. 6 illustrates one microlens and an associated pixel. The microlens array 50 is provided over a passivation layer 40, intervening layers 30 comprising a plurality of imager layers such as a color filter array and metallization layers, and an array of imaging pixels 25 associated with a semiconductor substrate 15. Each pixel 25 has a photosensor (i.e., photosensitive region) for converting photons to electrical charges.

As better shown in FIG. 6, each microlens 20 has a flat upper surface with a plurality of lens material units 82a, 82b, 82c, 82d, 82e, 82f separated by trenches 80a, 80b, 80c, 80d, 80e. The widths of the trenches 80a, 80b, 80c, 80d, 80e increase starting from the trench 80a closest to the center of the microlens 20, i.e., at lens material unit 82a, moving towards the trench 80e closest to the edge of the microlens 20, i.e., at lens material unit 82f. As the cross-sectional width of the trenches 80a, 80b, 80c, 80d, 80e increase, the distance between the trenches 80a, 80b, 80c, 80d, 80e, i.e., the cross-sectional widths of the lens material units 82b, 82c, 82d, 82e, 82f, decrease starting from the center of the microlens 20 (i.e., lens material unit 82a) moving towards the edge.

The light collection efficiency of each pixel 25 is increased by the plurality of trenches 80a, 80b, 80c, 80d, 80e in each microlens 20, which focuses a substantial amount of incident light 70 onto the photosensitive region in the pixel 25. The various cross-sectional widths $W_1$ of the trenches 80a, 80b, 80c, 80d, 80e introduce an average refractive index reduction starting from the microlens 20 center, i.e., lens material unit 82a, towards the microlens 20 edge, i.e., lens material unit 82f. The average refractive index is based on the refractive index of air, which fills the trenches, in relation to the refractive index of the lens material used to fabricate the lens material units 82a, 82b, 82c, 82d, 82e, 82f. The average refractive index will be higher when incident light 70 impinge upon an area of the microlens 20 with more lens material than air. Consequently, the average refractive index will be lower when incident light 70 impinges upon an area of the microlens 20 with more air than lens material. As a result, incident light 70, shown in FIGS. 5 and 6, will pass in a substantially straight line at the center of the microlens 20 to the photosensitive region of the each pixel 25. While light 70 entering closer to the edge of the microlens, will bend toward the photosensitive region. The amount of bending depends upon the change in value of the average refractive index from the center to the edge of the microlens 20.

The distance traveled by incident light 70 in an imaging system is the optical path length L, such that L=n*t. The optical path length L for a flat shaped microlens 20 constructed in accordance with the invention has a constant thickness t of the lens material units 82a, 82b, 82c, 82d, 82e, 82f and a varying average refractive index n, which is due to the varying cross-sectional widths $W_1$ of the trenches 80a, 80b, 80c, 80d, 80e as described above.

The average refractive index between the trenches and the lens material units can be expressed by the following formula:

$$n(average)=[n1*W_1+n2*W_2]/(W_1+W_2),$$

where n1 and n2 represent the refractive indices of the trench (n1) and the lens material unit (n2). As a few examples of how the value of n(average) changes in accordance with changes in $W_1$ and $W_2$ concludes the following:

$$n(average)=n2 \text{ when } W_1=0;$$

$$n(average)=n1 \text{ when } W_2=0; \text{ and}$$

$$n(average)=0.5*n1+0.5*n2 \text{ when } W_2=W_1.$$

As can be readily seen, the value of n(average) changes as $W_1$ and/or $W_2$ changes from the center to the edge of the microlens 20.

Although all illustrated embodiments of the invention fill the microlens 20 trenches with air, the trenches may also be filled with other gases or solid materials as long as the index of refraction of the microlens 20 reduces in a direction from the center of the microlens 20 to its edge. Additionally, even though various embodiments of the invention are shown in a square and circular top down shapes, other top-down shapes may also be used.

Figure 7C:
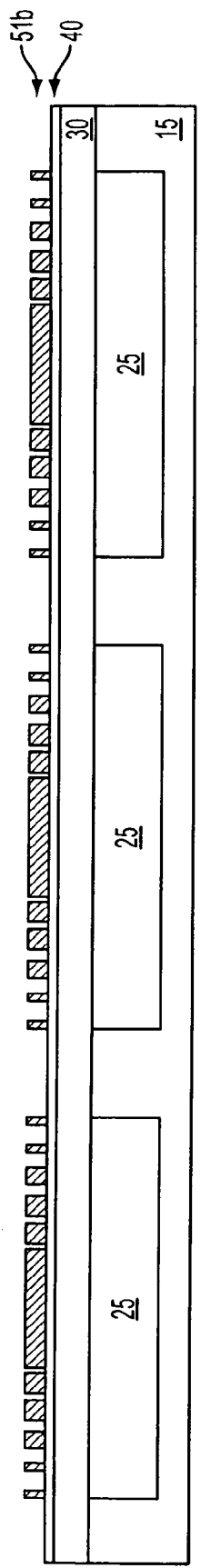
Figure 7D:
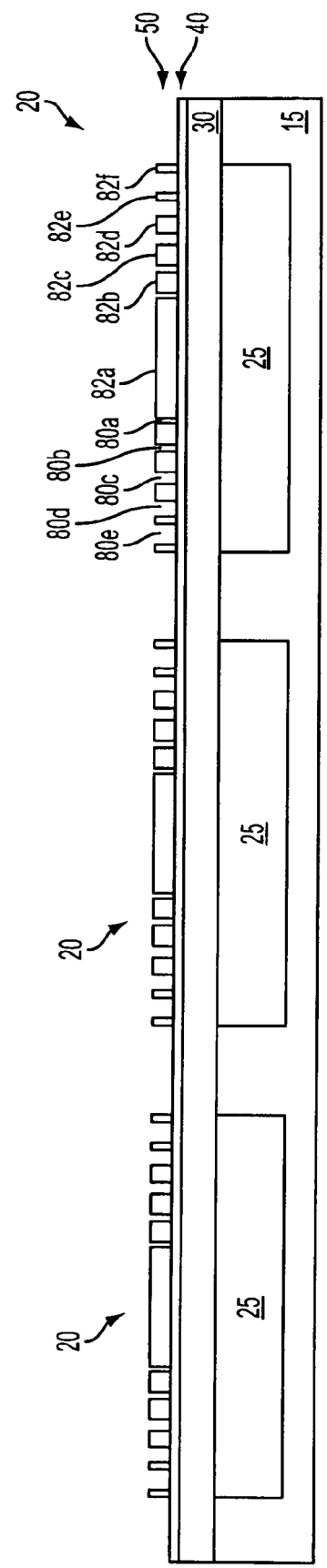

FIGS. 7a through 7d are cross-sectional views illustrating one example of a method of manufacturing a microlens array 50 (FIG. 7d). It should be understood that any conventional fabrication process can be used to the manufacture of the microlens array 50 (FIG. 7d); even though, a photolithography process is discussed below. First, as shown in FIG. 7a, photoresist 51a is layered over a passivation layer 40, intervening layers 30, and an array of imaging pixels 25 fabricated on semi-conductive substrate 15. The photoresist 51a layer can comprise any conventional photoresist material. As shown in FIG. 7b, a mask 55 is positioned over the photoresist 51a which is exposed to light. As part of the manufacturing process, the mask 55 is patterned to form a plurality of microlenses 20 in the microlens array 50 (FIG. 7d). Additionally, the mask 55 is patterned to form within each microlens 20 a plurality of lens material units 82a, 82b, 82c, 82d, 82e, 82f separated from each other by a plurality of trenches 80a, 80b, 80c, 80d, 80e (FIG. 7d).

As shown in FIG. 7c, the exposed portions of the photoresist 51a are developed forming a patterned photoresist 51b. After developing, the photoresist 51b comprises a plurality of microlenses 20 constructed in accordance with the invention. Referring to FIG. 7d, the patterned photoresist 51b is hardened to form a microlens array 50 comprising a plurality of microlenses 20 with a flat upper surface, each microlens 20 comprising a plurality of lens material units 82a, 82b, 82c, 82d, 82e, 82f separated from each other by a plurality of trenches 80a, 80b, 80c, 80d, 80e.

Figure 8C:
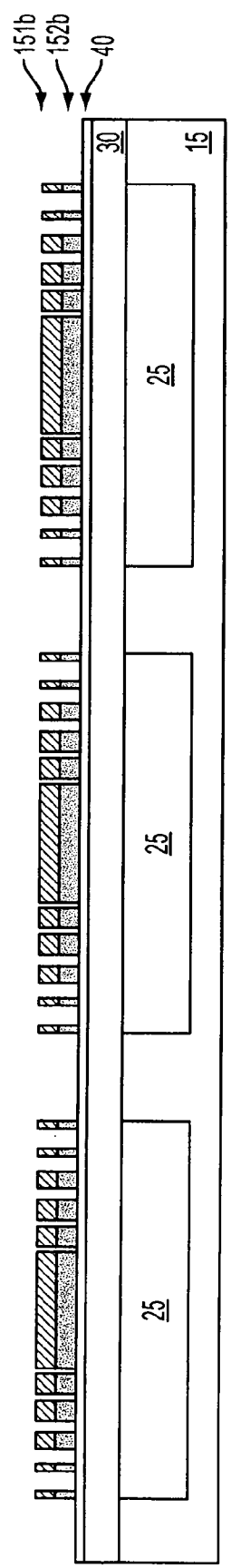
Figure 8D:
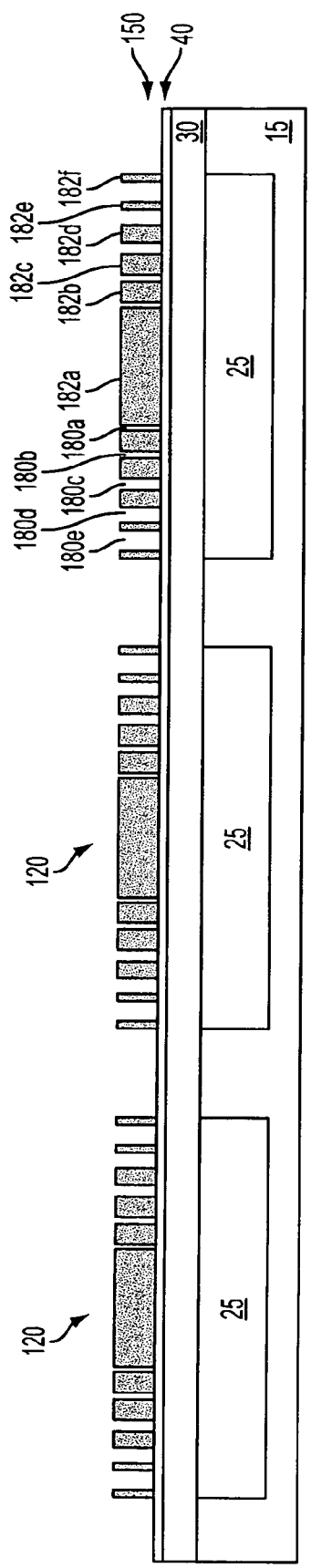

FIGS. 8a through 8d show another process of forming a microlens array 150 constructed in accordance with the invention, in which a photoresist is used as an etching mask. Photoresist 151a is layered over lens material layer 152a (FIG. 8a). The lens material layer 152a can comprise nitride, oxide, or any inorganic or transparent material that can be patterned. As shown in FIG. 8b, a mask 155 is positioned over the photoresist 151a, which is exposed to light. The mask 155 is also patterned to expose portions of the photoresist 151a used to form within each microlens 120 a plurality of lens material units 182a, 182b, 182c, 182d, 182e, 182f separated from each other by a plurality of trenches 180a, 180b, 180c, 180d, 180e with varying cross-sectional widths. As shown in FIG. 8c, the exposed portions of the photoresist 151a are developed forming a patterned photoresist 151b, which is then hardened and used as an etch mask for lens material layer 152a to form etched lens material layer 152b. As shown in FIG. 8d, the photoresist 151b is removed and the etched lens material layer 152b remains forming a microlens array 150 including a plurality of microlenses 120 with a flat upper surface comprising a plurality of lens material units 182a, 182b, 182c, 182d, 182e, 182f separated from each other by a plurality of trenches 180a, 180b, 180c, 180d, 180e.

Figure 9:
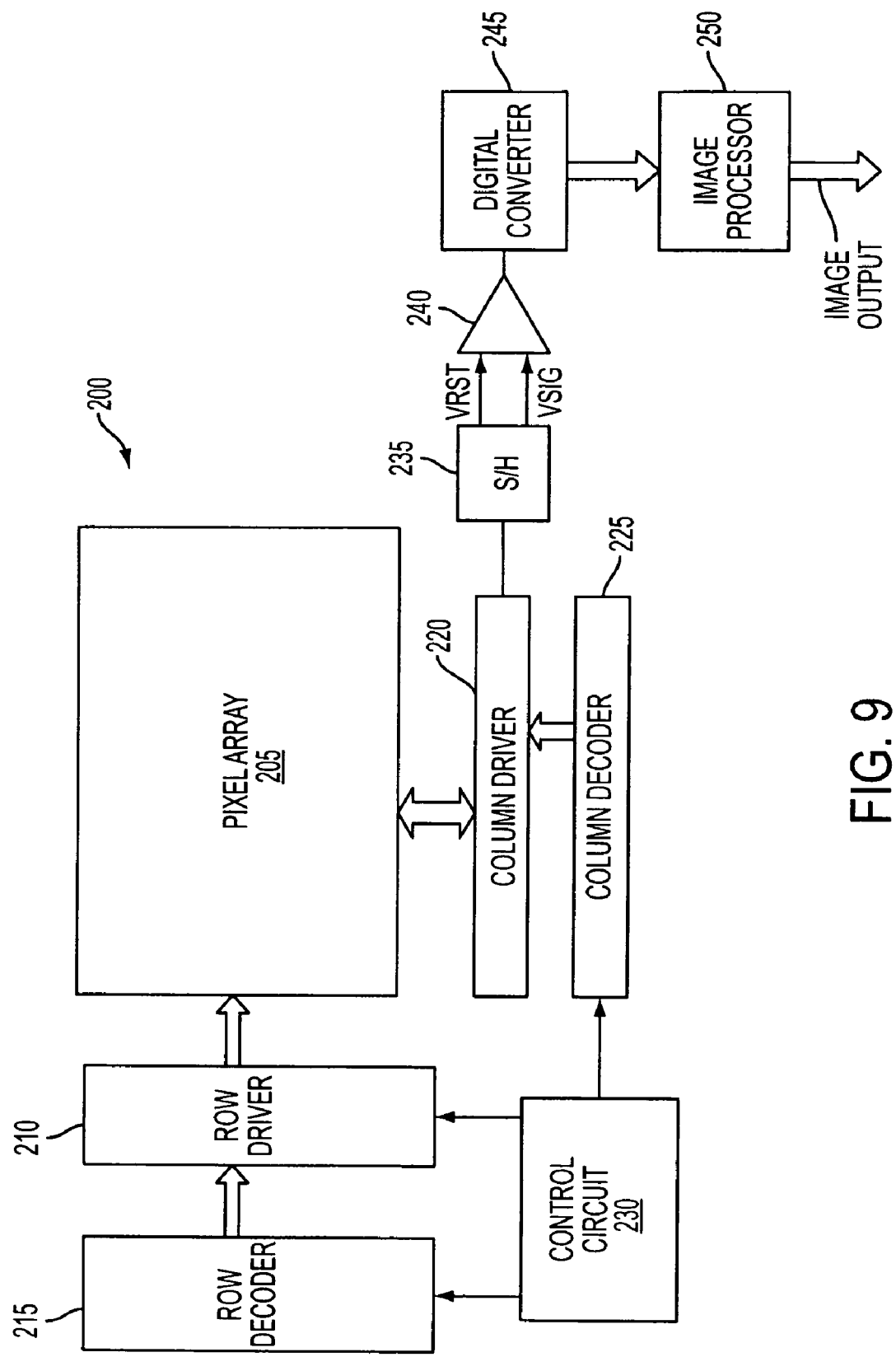
FIG. 9 illustrates a block diagram of a CMOS imager having a microlens array constructed in accordance with the invention.

FIG. 9 illustrates a block diagram of a CMOS image sensor having a microlens array constructed in accordance with the invention. The imager sensor 200 has a pixel array 205 comprising a plurality of pixels 25 with microlenses 20, 120 constructed as described above. Row lines are selectively activated by a row driver 210 in response to row address decoder 215. A column driver 220 and column address decoder 225 are also included in the imager sensor 200. The imager sensor 200 is operated by the timing and control circuit 230, which controls the address decoders 215, 225. The control circuit 230 also controls the row and column driver circuitry 210, 220.

A sample and hold circuit 235 associated with the column driver 220 reads a pixel reset signal Vrst and a pixel image signal Vsig for selected pixels 25 of the pixel array 205. A differential signal (Vrst−Vsig) is produced by differential amplifier 240 for each pixel 25 and is digitized by analog-to-digital converter 245. The analog-to-digital converter 245 supplies the digitized pixel 25 signals to an image processor 250, which forms and outputs a digital image.

The invention may be used with a pixel array of any type of solid state sensor, the CMOS image sensors 200 illustrated in FIG. 9. FIG. 10 illustrates a system 100 utilizing an image sensor 200 including an array of pixels 25 comprising a microlens array 50 constructed and operated in accordance with the invention. Without being limiting, such a system could include a camera system, computer system, scanner, machine vision system, vehicle navigation system, cell phone, personal digital assistant and any other system employing an image sensor. The system 100, for example a still or video camera system, generally comprises a camera processor or central processing unit (CPU) 105, such as a microprocessor, that communicates with an input/output (I/O) device 115 over a bus 130. Image sensor 200 also communicates with the CPU 105 over bus 130. The system 100 also includes random access memory (RAM) 120, and can include removable memory 125, such as flash memory, which also communicate with CPU 105 over the bus 130. Image sensor 200 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A microlens structure comprising:
    a microlens provided above a pixel, the microlens comprising a lens material unit comprising a plurality of separated blocks arranged in rows and columns separated by a plurality of trenches, wherein the lens material unit has a substantially flat upper surface.
2. The structure of claim 1, wherein the plurality of trenches have varying cross-sectional widths from a center to an edge of the microlens.
3. The structure of claim 1, wherein the plurality of trenches have varying cross-sectional widths increasing from a center to an edge of the microlens.
4. The structure of claim 3, wherein blocks of the lens material unit have varying cross-sectional widths decreasing from a center to an edge of the microlens.
5. The structure of claim 3, wherein cross-sectional widths of blocks of the lens material remain constant from a center to an edge of the microlens.
6. The structure of claim 1, wherein the microlens has a substantially square shape.
7. An image sensor comprising:
    a pixel array comprising a plurality of pixels, each having a photosensor;
    a microlens array formed over the pixel array, the microlens array comprising a plurality of microlenses with a substantially flat upper surface, each microlens comprising a lens material unit comprising a plurality of separated blocks arranged in rows and columns separated by a plurality of trenches; and
    a fill material filling the trenches;
    wherein an index of refraction of the fill material and an index of refraction of the lens material unit of an associated microlens introduce an average refractive index reduction from a center to an edge of an associated microlens.
8. The image sensor of claim 7, wherein the fill material is air.
9. The image sensor of claim 7, wherein the plurality of trenches have varying cross-sectional widths increasing from a center to an edge of an associated microlens.
10. The image sensor of claim 9, wherein cross-sectional widths of blocks of the lens material unit decrease in a direction from a center towards an edge of the associated microlens.
11. The image sensor of claim 9, wherein cross-sectional widths of blocks of the lens material unit remain substantially the same width in a direction from a center towards an edge of the associated microlens.
12. The image sensor of claim 9, wherein cross-sectional widths of blocks of the lens material unit remain constant from a center to an edge of the associated microlens.
13. The image sensor of claim 9, wherein blocks of the lens material unit have varying cross-sectional widths decreasing from a center to an edge of the associated microlens.
14. A pixel array comprising:
    a plurality of pixels; and
    an array of microlenses over the plurality of pixels, each microlens having a substantially flat upper surface and an average refractive index reduction from a center to an edge of an associated microlens, wherein each microlens comprises a lens material unit comprising a plurality of separated blocks arranged in rows and columns separated by a plurality of trenches.
15. The pixel array of claim 14, wherein cross-sectional widths of blocks of the lens material unit decrease while cross-sectional widths of the trenches increase in a direction from a center to an edge of an associated microlens.
16. The pixel array of claim 14, wherein cross-sectional widths of blocks of the lens material unit remains substantially the same while cross-sectional widths of the trenches increases in a direction from a center to an edge of an associated microlens.
17. The pixel array of claim 14, wherein an index of refraction of air and an index of refraction of the lens material unit of an associated microlens introduce the average refractive index reduction.
18. A camera system comprising:
    a processor; and
    an imager connected to the processor and comprising:
    a substrate having a plurality of pixels formed thereon, each pixel having a photosensor; and
    a microlens array formed above the pixels and comprising a plurality of microlenses, each microlens including a lens material unit, each lens material unit comprising a plurality of separated blocks arranged in rows and columns separated by a plurality of trenches, wherein the lens material unit has a substantially flat upper surface;
    wherein from a center to an edge of at least one of the microlenses a cross-sectional width of a trench is greater than a cross-sectional width of a previous trench;
    wherein from the center to the edge of the at least one of the microlenses a cross-sectional width of a block of the lens material unit is smaller than a cross-sectional width of a previous block of the lens material unit.
19. A method of fabricating a microlens array comprising: applying a microlens material over a pixel array; and patterning the microlens material to form a set of microlenses having at least one microlens comprising a lens material unit comprising a plurality of separated blocks arranged in rows and columns separated by a plurality of trenches, wherein the patterning step further comprises patterning the microlens material to form a set of microlenses having a substantially flat upper surface.

20. The method of claim 19, wherein the plurality of trenches having differing cross-sectional widths.

21. The method of claim 19, wherein blocks of the lens material unit have differing cross-sectional widths.

22. The method of claim 19, wherein the plurality of trenches have cross-sectional widths increasing from a center to an edge of the at least one microlens.

23. The method of claim 22, wherein blocks of the lens material unit have cross-sectional widths decreasing from a center to an edge of the at least one microlens.

24. The method of claim 22, wherein blocks of the lens material units have cross-sectional widths which remain constant from a center to an edge of the at least one microlens.

25. The method of claim 19, wherein the plurality of trenches have cross-sectional widths increasing from a center to an edge of the at least one microlens while blocks of the lens material unit have cross-sectional widths which remain constant from the center to the edge of the at least one microlens.

26. The method of claim 19, wherein the plurality of trenches have cross-sectional widths increasing from a center to an edge of the at least one microlens while blocks of the lens material unit have cross-sectional widths decreasing from the center to the edge of the at least one microlens.

27. The method of claim 19, wherein the microlens material comprises photoresist material.

28. The method of claim 19, wherein the microlens material comprises any inorganic material that can be patterned.

29. The method of claim 19, wherein each microlens has a substantially square top down shape.

30. A method of forming an image sensor comprising:
    forming a pixel array comprising a plurality of pixels in a substrate, each pixel having a photosensor;
    forming a microlens array having a substantially flat upper surface and comprising a plurality of microlenses, each microlens having a lens material unit comprising a plurality of separated blocks arranged in rows and columns separated by a plurality of trenches, each microlens being positioned above at least one pixel of the pixel array; and
    filling the trenches with a fill material;
    wherein the cross-sectional widths of the trenches increase in the direction starting from a focal point of the photosensor towards an edge of an associated microlens, the focal point being aligned with a center of the associated microlens.

31. The method of claim 30, wherein the cross-sectional widths of blocks of the lens material unit decrease in a direction from a center to an edge of a microlens.

32. The method of claim 30, wherein the cross-sectional widths of blocks of the lens material unit remain constant in a direction from a center to an edge of a microlens.

33. The method of claim 30, wherein the fill material is air and the refractive index of air in relation to the refractive index of the microlens material introduces an average refractive index reduction in a direction from the center to the edge of the microlens.

34. The method of claim 30, wherein the act of forming a microlens array comprises forming a plurality of flat upper surface for the microlenses.

35. The method of claim 30, wherein the fill material is air.

* * * * *